(12) United States Patent
Lam et al.

(10) Patent No.: US 8,017,432 B2
(45) Date of Patent: Sep. 13, 2011

(54) DEPOSITION OF AMORPHOUS PHASE CHANGE MATERIAL

(75) Inventors: Chung Hon Lam, Yorktown Heights, NY (US); Alejandro G. Schrott, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/684,185

(22) Filed: Jan. 8, 2010

(65) Prior Publication Data

US 2011/0168966 A1    Jul. 14, 2011

(51) Int. Cl.
*H01L 21/06* (2006.01)

(52) U.S. Cl. ............ 438/102; 438/103; 257/E21.068

(58) Field of Classification Search .......... 438/102, 438/103; 257/E21.068
See application file for complete search history.

(56) References Cited

U.S. PATENT DOCUMENTS

| | | | |
|---|---|---|---|
| 6,946,359 B2 | 9/2005 | Yang et al. | |
| 6,958,112 B2 | 10/2005 | Karim et al. | |
| 7,067,440 B1 | 6/2006 | Bayman et al. | |
| 7,097,886 B2 | 8/2006 | Moghadam et al. | |
| 7,271,112 B1 | 9/2007 | Papasouliotis et al. | |
| 7,273,811 B2 | 9/2007 | Xie | |
| 7,294,583 B1 | 11/2007 | Rulkens et al. | |
| 7,351,992 B2 | 4/2008 | Scheuerlein | |
| 7,384,825 B2 | 6/2008 | Park et al. | |
| 7,427,568 B2 | 9/2008 | Chen et al. | |
| 7,471,555 B2 | 12/2008 | Lung | |
| 7,485,487 B1 | 2/2009 | Breitwisch et al. | |
| 7,498,064 B2 | 3/2009 | Horii | |
| 7,510,929 B2 | 3/2009 | Chen | |
| 7,569,844 B2 | 8/2009 | Lung | |
| 7,575,776 B2 | 8/2009 | Horii | |
| 7,599,217 B2 | 10/2009 | Lai et al. | |
| 7,838,329 B2 * | 11/2010 | Hunks et al. | 438/102 |
| 2006/0049389 A1 | 3/2006 | Lankhorst et al. | |
| 2007/0170542 A1 | 7/2007 | Derderian | |
| 2008/0054244 A1 | 3/2008 | Lee et al. | |
| 2008/0194106 A1 | 8/2008 | Oh et al. | |
| 2008/0247226 A1 | 10/2008 | Liu et al. | |
| 2009/0072216 A1 | 3/2009 | Lung et al. | |
| 2009/0098678 A1 | 4/2009 | Lung | |
| 2009/0124039 A1 * | 5/2009 | Roeder et al. | 438/99 |
| 2009/0227092 A1 * | 9/2009 | Fournier et al. | 438/483 |

OTHER PUBLICATIONS

U.S. Appl. No. 12/616,492; Chen et al.; filed Nov. 11, 2009.
Choi, B. et al., Cyclic PECVD of GeSbTe Films Using Metalorganic Sources, Journal of the Electrochemical Society, 2007, pp. 318-324, vol. 154, No. 4, ECS.
Ryu et al., Crystallization Behavior and Physical Properties of Sb-Excess Ge2Sb2+xTe5 Thin Films for Phase Change Memory (PCM) Devices, Journal of the Electrochemical Society, 2006, pp. G234-G237, vol. 153 (3), The Electrochemical Society.

(Continued)

*Primary Examiner* — Alexander G Ghyka
*Assistant Examiner* — Leonard Chang
(74) *Attorney, Agent, or Firm* — Cantor Colburn LLP; Vazken Alexanian

(57) ABSTRACT

A method for formation of a phase change memory (PCM) cell includes depositing amorphous phase change material in a via hole, the via hole comprising a bottom and a top, such that the amorphous phase change material is grown on an electrode located at the bottom of the via hole; melt-annealing the amorphous phase change material; and crystallizing the phase change material starting at the electrode at the bottom of the via hole and ending at the top of the via hole.

10 Claims, 7 Drawing Sheets

OTHER PUBLICATIONS

Lee, J. et al. High Scalable Phase Change Memory with CVD GeSbTe for Sub 50nm Generation, Symposium on VLSI Technology Digest of Technical Papers, Jun. 12-14, 2007, pp. 102-103, IEEE, Kyoto.

Van Pieterson et al., Phase-change recording materials with a growth-dominated crystallization mechanism: A materials overview, Journal of Applied Physics, 2005, pp. 083520-1-083520-7, vol. 97, American Institute of Physics.

Wuttig et al., Phase change materials: From material science to novel storage devices, Applied Phsyics A, 2007, pp. 411-417, vol. 87, Springer-Verlag, Germany.

Notification of Transmittal of the International Search Report and The Written Opinion of the International Searching Authority, or the Declaration; date of mailing Jan. 10, 2011; PCT/US2010/055200.

Written Opinion of the International Searching Authority (PCT); date of mailing Jan. 10, 2011; PCT/US2010/055200.

\* cited by examiner

DEPOSITION OF AMORPHOUS PHASE CHANGE MATERIAL

FIELD

This disclosure relates generally to the field of phase change memory fabrication.

DESCRIPTION OF RELATED ART

Phase-change memory (PCM) is a type of non-volatile computer memory. PCM stores data in cells comprising a phase change material, which can be switched between two distinct states, i.e., crystalline and amorphous, with the application of heat. The phase change material may be deposited and patterned to form individual PCM cells. However, as PCM cells become smaller, it becomes difficult to pattern the cells using etching techniques such as reactive ion etching (RIE), as RIE may change the chemical makeup of the phase change material within a region of about 10 nm from the feature's edge, which may preclude following the scaling road map since the damaged region may constitute all the phase change material in the cell at small dimensions.

Alternately, a small amount of phase change material may be deposited in a small hole, or via, to form an individual PCM cell. Chemical vapor deposition (CVD) and atomic layer deposition (ALD) methods may be used to deposit the phase change material in either a crystalline or amorphous state. However, these methods may produce polycrystalline phase change material with crystals larger than the size of the via hole, which may not properly fill the via hole, or amorphous phase change material which may form voids and lose contact with an electrode located at the bottom of the via hole upon crystallization, as the phase change material may shrink as it changes from the amorphous state to the crystalline state.

SUMMARY

In one aspect, a method for formation of a phase change memory (PCM) cell includes depositing amorphous phase change material in a via hole, the via hole comprising a bottom and a top, such that the amorphous phase change material is grown on an electrode located at the bottom of the via hole; melt-annealing the amorphous phase change material; and crystallizing the melted phase change material starting at the electrode at the bottom of the via hole and ending at the top of the via hole.

In one aspect, a phase change memory (PCM) cell includes a via hole, the via hole comprising a bottom and a top; an electrode located at the bottom of the via hole; and amorphous phase change material deposited in the via hole such that the amorphous phase change material is grown on the electrode during deposition, wherein the amorphous phase change material is further configured to crystallize starting at the electrode and ending at the top of the via hole when subjected to a melt-annealing process.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for deposition of amorphous phase change material are provided, with exemplary embodiments being discussed below in detail. A single crystal of a phase change material may be selectively grown on an electrode inside a via hole, filling the via hole and preventing void formation between the phase change material crystal and the electrode, as is described in U.S. application Ser. No. 12/616,492 (Lam et al.), filed on Nov. 11, 2009, which is herein incorporated by reference in its entirety. Amorphous phase change material may also be grown by selective nucleation on an electrode in a via hole using deposition methods such as CVD or ALD at a relatively low temperature as compared to crystalline growth, under 150° C. in some embodiments. Deposition at a lower temperature allows for good control of growth rate, and also permits introduction of dopants. After deposition, the amorphous phase change material may be melt-annealed in order to crystallize the phase change material starting at the electrode at the bottom of the via hole. Crystallization of the phase change material may then move through the phase change material from the bottom to the top of the via hole, preventing the formation of a seam typical of deposition processes and thus void formation upon crystallization of the phase change material and increasing the adhesion of the phase change material to the bottom electrode.

Figure 1:
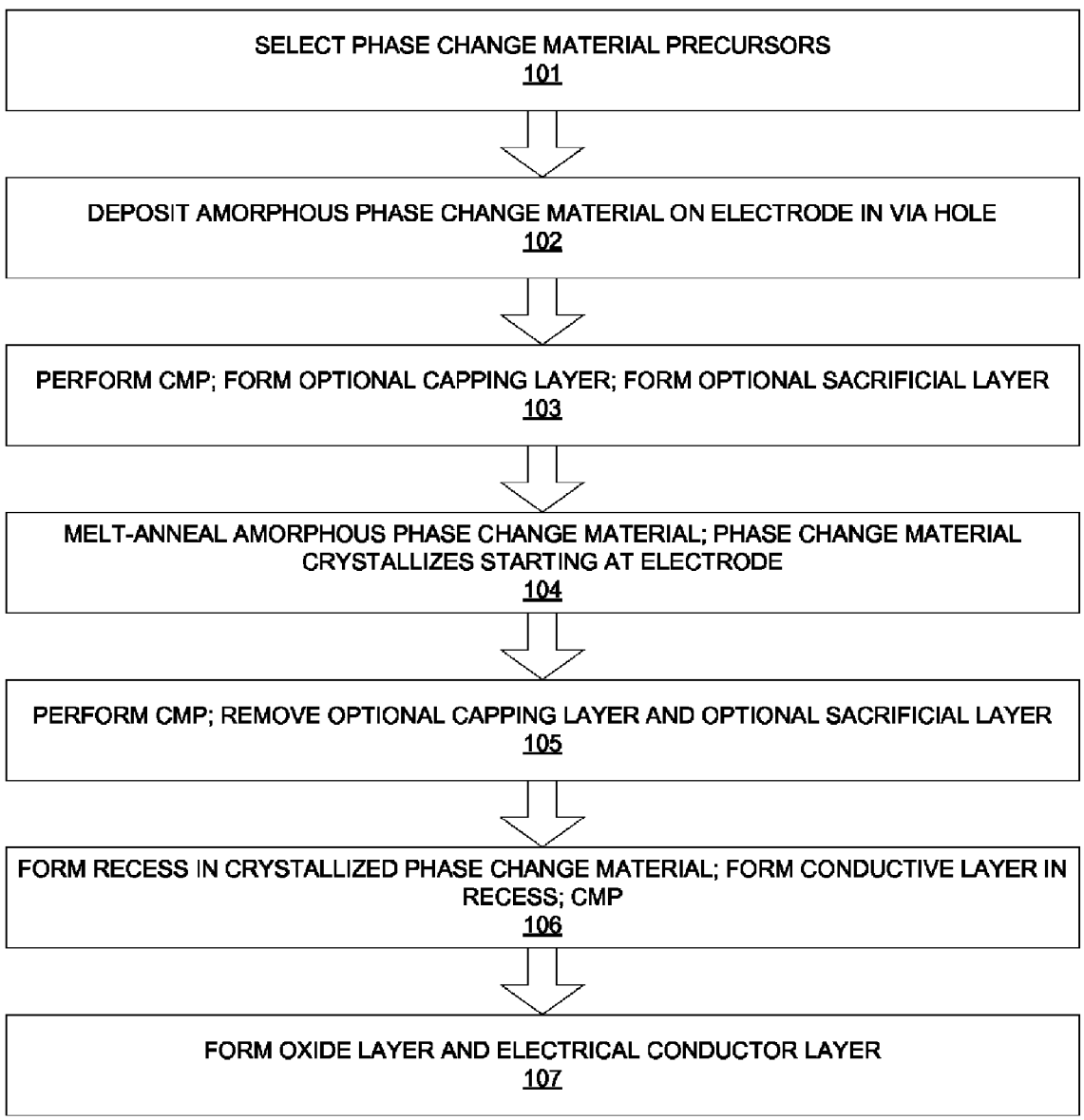
FIG. 1 illustrates an embodiment of a method for deposition of amorphous phase change material.

FIG. 1 illustrates an embodiment of a method for deposition of amorphous phase change material. In block 101, the electrode material, the dielectric material, the CVD or ALD precursors that are used to form the amorphous phase change material, and the deposition temperature are selected such that selective amorphous growth of the phase change material starts directly on the top of the electrode, which is at the bottom of the via hole. The electrode material, the precursors and the deposition sequence used to form the phase change material may be chosen such that the precursors used to form the phase change material react with the electrode material, and amorphous growth of the phase change material occurs directly on the electrode. The phase change material precursors and the deposition sequence may also be selected such that the precursors do not react with the dielectric layer located over the electrode in which the via hole is formed. In some embodiments, the electrode may comprise a conductive metal such as tungsten (W) or titanium nitride (TiN). The phase change material may comprise germanium (Ge), antimony (Sb), tellurium (Te) or selenium (Se), and the precursors may comprise organo-metallic or halide or alkylsilyl compounds in some embodiments. The dielectric may comprise silicon oxide or silicon nitride oxide in some embodiments.

Figure 2:
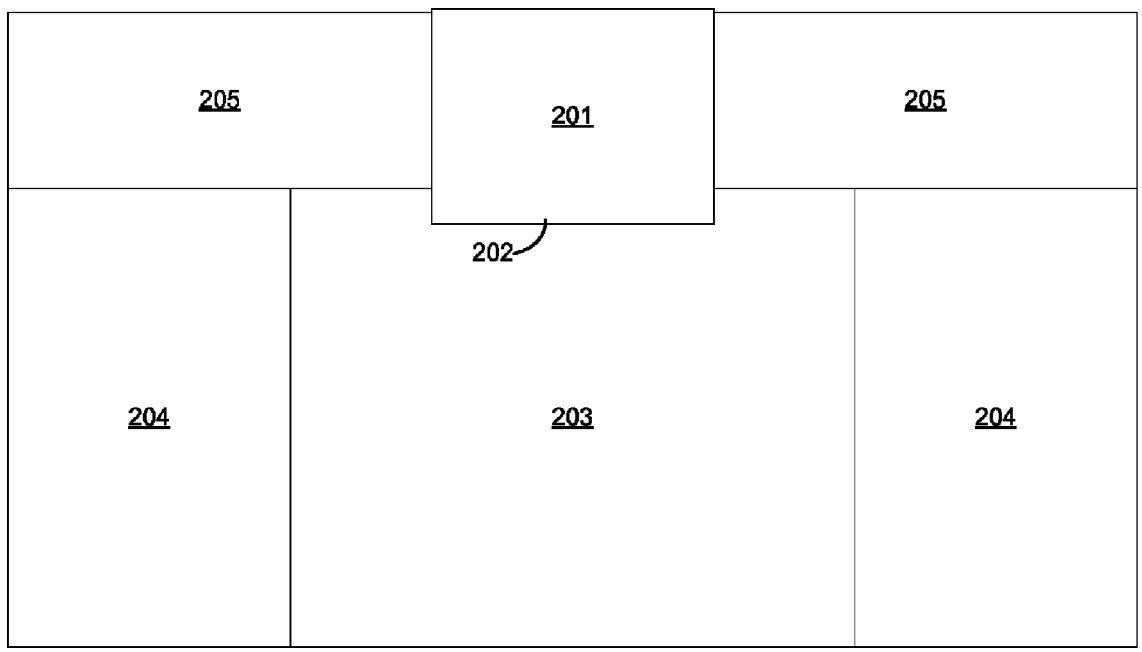
FIG. 2 illustrates an embodiment of a PCM cell after deposition of amorphous phase change material.

In block 102, as shown in FIG. 2, deposition of amorphous phase change material 201 in via hole 202 using the precursors selected in block 101 is performed using either CVD or ALD methods. Via hole 202 extends through dielectric 205 to electrode 203, and electrode 203 is surrounded by dielectric 204. Growth of the amorphous phase change material starts at electrode 203 at the bottom of via hole 202, and continues until a via hole 202 is filled with the amorphous phase change material 201. The precursors of phase change material 201 react with the material comprising electrode 203, and do not react with dielectric 205, causing growth to start on electrode 203 at the bottom of via hole 202. Deposition of amorphous phase change material 201 via CVD or ALD may be performed at temperatures below about 150° C. in some embodiments; the exact temperature at which deposition is performed depends on the precursors and the electrode material.

Figure 3:
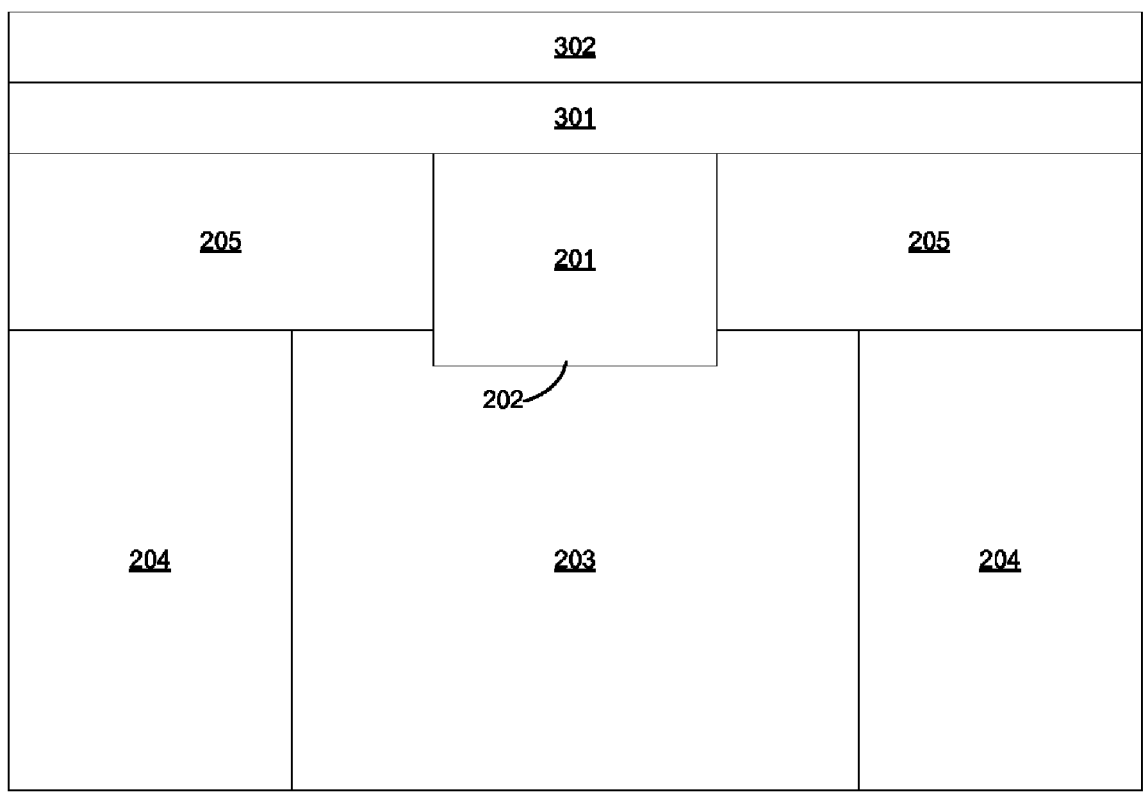
FIG. 3 illustrates an embodiment of a PCM cell after chemical mechanical polishing.

In block 103, the phase change material 201 may be subjected to a chemical mechanical polishing (CMP) process to remove any portion of phase change material 201 that is not inside via hole 202. Then, as shown in FIG. 3, an optional capping layer 301 may then be formed over the phase change material 201. Optional capping layer 301 may comprise $Ge_3N_4$, $GeCrN_X$, or $SiN_X$ in some embodiments. An optional sacrificial layer 302 may be formed on the optional capping layer 301. Optional sacrificial layer 302 may comprise any appropriate thermally insulating material. Optional sacrificial layer 302 may comprise $SiO_2$, Al2O3, or a film about 80% ZnS and about 20% $SiO_2$ in some embodiments. Optional capping layer 301 and optional sacrificial layer 302 may comprise any appropriate material having a lower thermal conductivity than the thermal conductivity of electrode 203 in some embodiments.

Figure 4:
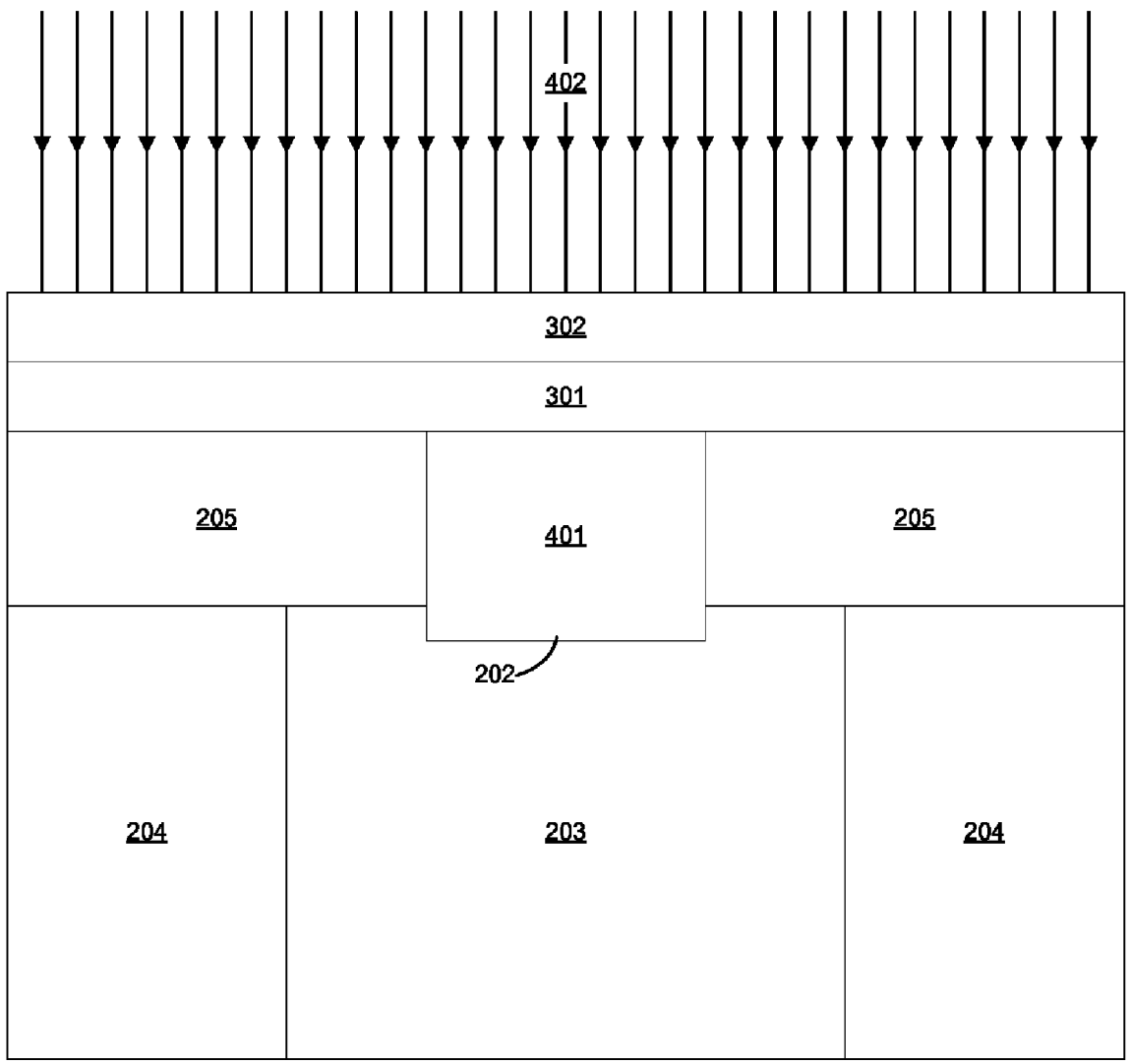
FIG. 4 illustrates an embodiment of a PCM cell during melt-annealing.

In block 104, amorphous phase change material 201 is melt-annealed, resulting in bottom-up crystallization of the phase change material. In some embodiments, melt-annealing may be performed using a laser pulse; in other embodiments, annealing may be performed by a rapid thermal annealing (RTA) process. Annealing initially melts the amorphous phase change material; the melted phase change material subsequently crystallizes. FIG. 4 illustrates annealing using a laser pulse 402. Melted phase change material 401 crystallizes starting at electrode 203 at the bottom of via hole 202. Crystallization of melted phase change material 401 continues up to the top of via hole 202, up to optional capping layer 301 in embodiments that comprise an optional capping layer 301. The main heat loss during annealing occurs through electrode 203, due to the thermal conductive nature of electrode 203; this causes crystallization of phase change material 401 to start at the electrode 203. Dielectric 205, optional capping layer 301, and optional sacrificial layer 302, which surround the phase change material 401 in some embodiments, may further encourage heat loss to occur via electrode 203 during annealing. Optional capping layer 301 may also prevent evaporation of phase change material 401 during annealing, and optional sacrificial layer 302 may act to trap heat during annealing. In embodiments in which the annealing process is sufficiently short (on the order of microseconds), optional capping layer 301 and optional sacrificial layer 302 may not be necessary. In some embodiments, the melting pulse used to melt-anneal phase change material 401 may have a duration of less than about 500 milliseconds.

Figure 5:
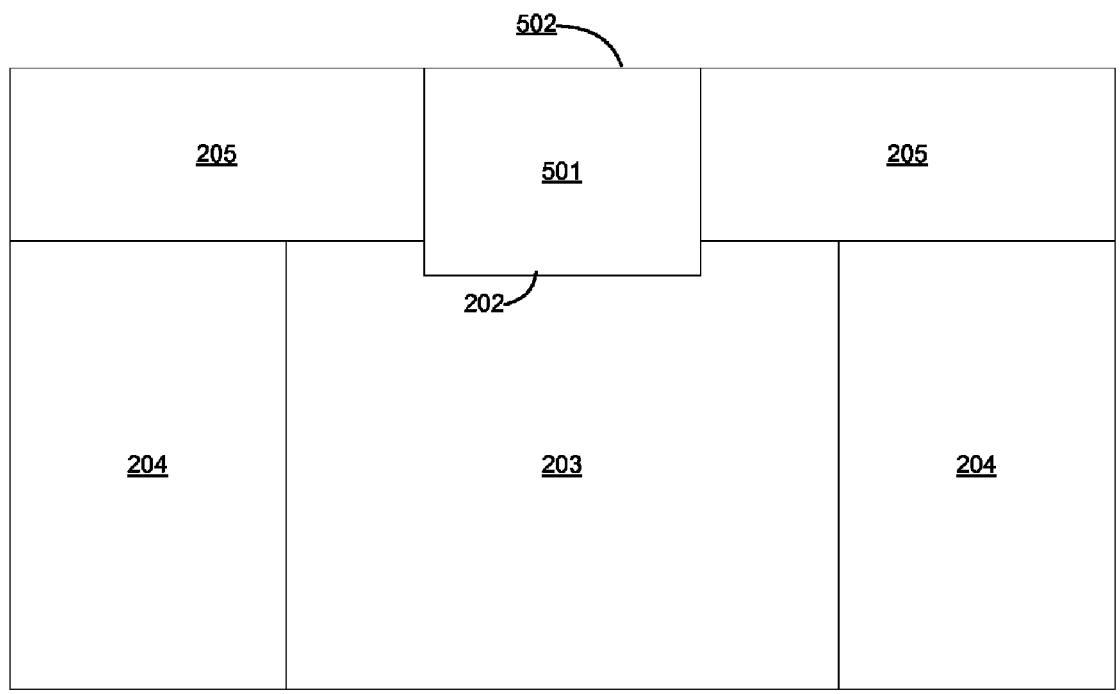
FIG. 5 illustrates an embodiment of a PCM cell comprising crystallized phase change material.

In block 105, CMP or a selective Reactive Ion Etching (RIE) process is performed on top surface 502, as shown cross section 500 of FIG. 5, comprising crystalline phase change material 501. In embodiments comprising optional capping layer 301 and optional sacrificial layer 302, optional capping layer 301 and optional sacrificial layer 302 are removed by the CMP or selective RIE process.

Figure 6:
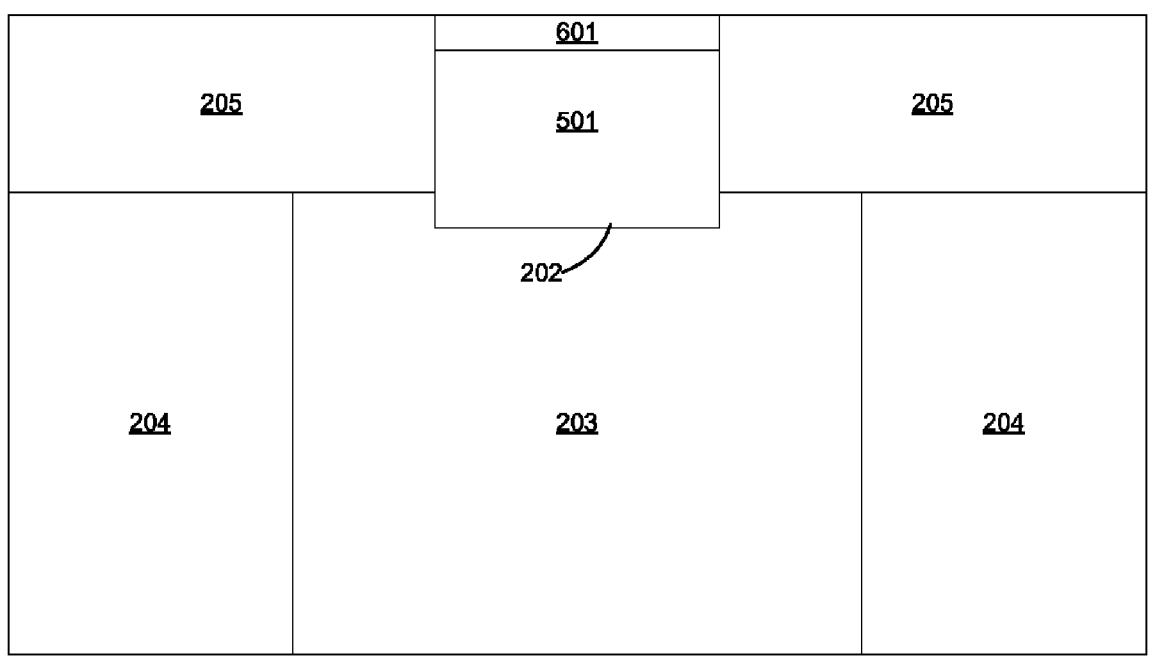
FIG. 6 illustrates an embodiment of a PCM cell comprising a conductive layer.

In block 106, a recess is formed in the crystallized phase change material 501, a conductive layer 601 is formed in the recess, and the surface comprising dielectric 205 and conductive layer 601 is polished, as is shown in cross-section 600 of FIG. 6. Conductive layer 601 may comprise titanium nitride in some embodiments. Polishing may be performed using chemical mechanical polishing (CMP).

Figure 7:
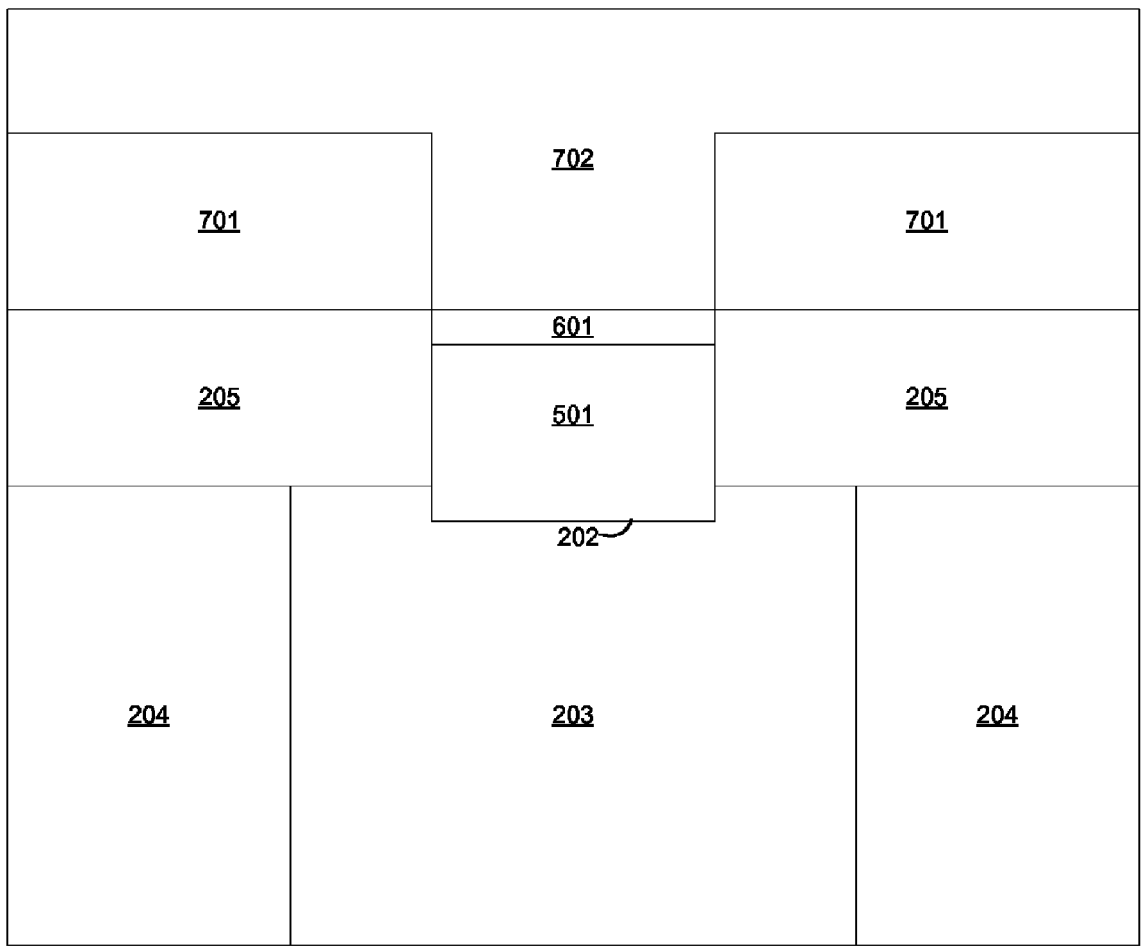
FIG. 7 illustrates an embodiment of a PCM cell comprising oxide and electrical conductor layers.

In block 107, oxide layers 701 and electrical conductor layer 702 are formed, as is shown in PCM cell cross-section 700 of FIG. 7. PCM cell 700 comprises crystalline phase change material 501 contacting electrode 203, which prevents formation of voids between the phase change material 501 and electrodes 203 when the phase change material 501 switches between the amorphous state and the crystalline state.

The technical effects and benefits of exemplary embodiments include formation of relatively small PCM cells while preventing void formation between the phase change material and the electrodes that comprise the PCM cells within the switching region.

The technical effects and benefits of exemplary embodiments include prevention of void formation upon crystallization of amorphous phase change material in a PCM cell.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for formation of a phase change memory (PCM) cell, the method comprising:
   depositing amorphous phase change material in a via hole, the via hole comprising a bottom and a top, such that the amorphous phase change material is grown on an electrode located at the bottom of the via hole;
   wherein the amorphous phase change material is deposited by one of atomic layer deposition (ALD) or chemical vapor deposition (CVD) and occurring at a temperature below about 150° C.;
   melt-annealing the amorphous phase change material; and
   crystallizing the phase change material starting at the electrode at the bottom of the via hole and ending at the top of the via hole.

2. The method of claim 1, wherein the electrode comprises one of titanium nitride (TiN) and tungsten (W).

3. The method of claim 1, wherein the amorphous phase change material comprises one or more of germanium (Ge), antimony (Sb), tellurium (Te) and selenium (Se).

4. The method of claim 1, wherein annealing the amorphous phase change material comprises one of a laser pulse and rapid thermal annealing (RTA).

5. The method of claim 1, further comprising forming a capping layer over the amorphous phase change material, and removing the capping layer after crystallizing the phase change material by one of a chemical mechanical polishing (CMP) or a selective Reactive Ion Etching (RIE) process.

6. The method of claim 5, wherein the capping layer comprises one of $Ge_3N_4$, $GeCRN_X$, or $SiN_X$.

7. The method of claim 5, further comprising forming a sacrificial layer over the capping layer, and removing the sacrificial layer during the CMP or RIE process, wherein the sacrificial layer comprises an insulating material.

8. The method of claim 7, wherein the insulating material comprises about 80% ZnS and about 20% $SiO_2$.

9. The method of claim 1, further comprising performing chemical mechanical polishing (CMP) after deposition of the amorphous phase change material, such that the CMP removes any phase change material that is not inside the via hole.

10. The method of claim 1, wherein the via hole extends through a dielectric layer that is located over the electrode, and wherein the amorphous phase change material does not react with the dielectric layer.

\* \* \* \* \*